United States Patent [19]

Burgess et al.

[11] Patent Number: 5,187,328

[45] Date of Patent: Feb. 16, 1993

[54] ENVIRONMENTALLY SEALED VEHICULAR AIR BAG SENSOR

[75] Inventors: James P. Burgess, Camarillo, Calif.; Dewey Mobley, Lake Orion; Al Vanderstuyf, Novi, both of Mich.

[73] Assignee: Electro Wire Products, Inc., Rochester Hills, Mich.

[21] Appl. No.: 619,012

[22] Filed: Nov. 28, 1990

[51] Int. Cl.$^5$ .......................... H05K 5/00; G01P 15/08
[52] U.S. Cl. .................................. 174/52.2; 174/52.1; 174/517 R
[58] Field of Search ............... 174/52.2, 52.1, 52.3, 174/50, 50.5, 50.51, 50.52, 50.53; 73/493, 517 R

[56] References Cited

U.S. PATENT DOCUMENTS 5,088,326  2/1992  Wada et al. ................ 73/517 R

Primary Examiner—Leo P. Picard
Assistant Examiner—Bot Ledynh
Attorney, Agent, or Firm—Krass & Young

[57] ABSTRACT

An environmentally sealed vehicular air bag sensor. The sensor employs a conventional ball and tube accelerometer which supplies an electrical signal when subjected to a deceleration of force equal to or greater than a preset limit. All of the electrical connections of the sensor are disposed in the interior thereof, and the interior is sealed from the operating environment of the vehicle, thus enhancing reliability and minimizing accidental damage thereto.

12 Claims, 2 Drawing Sheets

ENVIRONMENTALLY SEALED VEHICULAR AIR BAG SENSOR

BACKGROUND OF THE INVENTION

1. Field of the Inventions

This invention relates to the field of vehicular air bag sensors which, when subjected to a deceleration force exceeding a preset limit, are operative to generate a signal to cause actuation of the air bag, and, more particularly to such an air bag sensor which is environmentally sealed from the operating environment of the vehicle.

2. Description of the Relevant Prior Art

In response to a perceived public desire for more safety features in passenger motor vehicles, and in compliance with federal regulations, many vehicles now being manufactured in the United States are equipped with driver's side air bags as standard or optional equipment. By 1995, driver's side air bags will be standard equipment on all passenger motor vehicles manufactured or sold in the United States. Furthermore, it is expected that such air bags will increasingly become available as options on the passenger side of the vehicle, as well.

Typical vehicular air bags remain in a compacted, deflated state until activated. When the vehicle is subjected to a sudden decelerating force, such as is caused by the impact of hitting another vehicle or a stationary object, the bag is quickly activated and inflates by rapid expansion of various gasses to create a deformable cushion between the driver and the interior of the vehicle, thereby preventing injury to the driver, or greatly diminishing the severity thereof.

The designer of an air bag safety system is faced with two competing requirements. First, the bag must inflate promptly, almost instantly, after impact. On the other hand, the air bag must not inflate inappropriately, as may happen if the vehicle is nudged or bumped in traffic or travels over uneven terrain or potholes. An accidental and inappropriate inflation of the air bag may actually lead to severe accidents because the driver can no longer operate the vehicle. In view of these competing requirements, it is critical that the air bag system include an accurate and reliable sensor which will reliably generate an activation signal when the deceleration force to which the vehicle is subjected equals or exceeds a preset level, but will not generate the activation signal if the deceleration force falls below that level.

To this end, typical air bag systems employ one or more sensors which incorporate ball and tube accelerometers. In such an accelerometer, a ball of a certain mass is normally held by a magnet disposed at one end of the accelerometer. When the device is subject to a decelerating force of sufficient magnitude, the ball will become dislodged from the magnet. If the deceleration force is sufficient to overcome the attraction exerted by the magnet, the ball will roll to the other end of a tube and cause bridging of a pair of electrical terminals disposed at that end of the accelerometer and thereby producing a detectable electrical characteristic which may be used to trigger airbag inflation.

Typically, a pair of these sensors are mounted on either side of the front bumper of the vehicle. A third sensor is mounted in the center of the vehicle, and somewhat further toward the rear thereof. The third sensor acts as an override to prevent accidental activation of the air bag if the bumper sensors are subjected to relatively minor, and localized deceleration. The three sensors are in electrical communication with a central processing unit which evaluates the signals therefrom and is programmed to generate an activation signal to the air bag's actuation mechanism in appropriate circumstances.

The prior art sensors described above are successful, for the most part, in generating an activation signal only in appropriate circumstances. However, they do suffer from certain disadvantages. Typically, the sensor including the ball and tube accelerometer is provided as a single component. Electrical leads are mounted to the terminals of the accelerometer and extend out of the sensor component. These trailing electrical leads cause problems during manufacture of the sensor component since various assembly steps may place undue strain on the delicate leads, causing breakage or detachment from the terminals. This causes failure in a certain number of the prior art components. Furthermore, the prior art sensor components are often not sealed from the operating environment in which they will be installed. Hence, water, brine, and various corrosive environmental contaminants may enter the sensor component and cause short circuits, or other damage to the delicate electrical connections. Obviously, failure of a prior art sensor component due to environmental contamination may prove disastrous in an accident situation.

In our co-pending patent application Ser. No. 07/637,790, now U.S. Pat. No. 5,072,334, the disclosure of which is incorporated herein by reference, we disclosed and claim modular, replaceable, environmentally sealed, plug-in electrical components. By disposing the mating terminals of these plug-in electrical components inside a sealed housing, the electrical connection between the pairs of terminals is protected from environmental degradation. We have found that the principle of encapsulating the terminal engagement inside a sealed housing may be adapted for constructing our novel environmentally sealed air bag sensor. While the internally mating terminals disclosed in Ser. No. 07/637,790, now U.S. Pat. No. 5,072,334 are disengageable to permit quick replacement of the various modular components, we have found it more expedient in the present case to utilize non-disengageable terminal connections in certain circumstances.

SUMMARY OF THE INVENTION

Disclosed and claimed herein is an environmentally sealed vehicular air bag sensor. The sensor includes a housing which defines an interior. First and second electrical terminals are disposed in the interior and are matingly engageable with third and fourth electrical terminals, respectively, the third and fourth terminals being electrically connectable to the wiring system of a vehicle. Typically, the third and fourth terminals are connected to electrical leads which may be hand wired into the vehicle's wiring system, or the leads may have an appropriate connector attached thereto. The engagement between the first and third, and second and fourth electrical terminals takes place inside the interior of the housing.

An accelerometer is also disposed in the housing interior. The accelerometer is operative to generate an electrical signal when it is subjected to a deceleration force that exceeds a preset level. Typically, this will occur in a crash situation. The accelerometer is equipped with fifth and sixth electrical terminals which are in electrical communication with, respectively, the first and second terminals. Obviously, since all these terminals are disposed inside the housing terminal, such communication takes place inside the housing. Means are provided for sealing the interior of the housing from the operative environment of the vehicle. Typically, the sealing means will comprise a cap suitably configured to close off the interior of the housing and to permit the passage therethrough of the third and fourth terminals.

In one embodiment of the present invention, the air bag sensor is supplied as a component which includes the third and fourth terminals. That is, they are engaged with the first and second terminals, respectively. The vehicle manufacturer may then either hand wire the leads from the third and fourth terminals into the wiring system of the vehicle, or, if a pig-tail connector is supplied, may employ it in a wiring harness.

In an alternate embodiment, the sensor is supplied as a component without the third and fourth terminals. By appropriately designing the wiring system of the vehicle to include these third and fourth terminals, the sensor component may be connected to the vehicle wiring system by simply engaging the third and fourth terminals with the interiorly disposed first and second terminals, respectively. This "quick-connect" design has inherent advantages in certain manufacturing circumstances, and does permit easier replacement of a defective sensor component.

BRIEF DESCRIPTION OF THE DRAWINGS

The following detailed description may best be understood by reference to the following drawing in which.

DETAILED DESCRIPTION OF THE PREFERRED EMBODIMENTS

Figure 1:
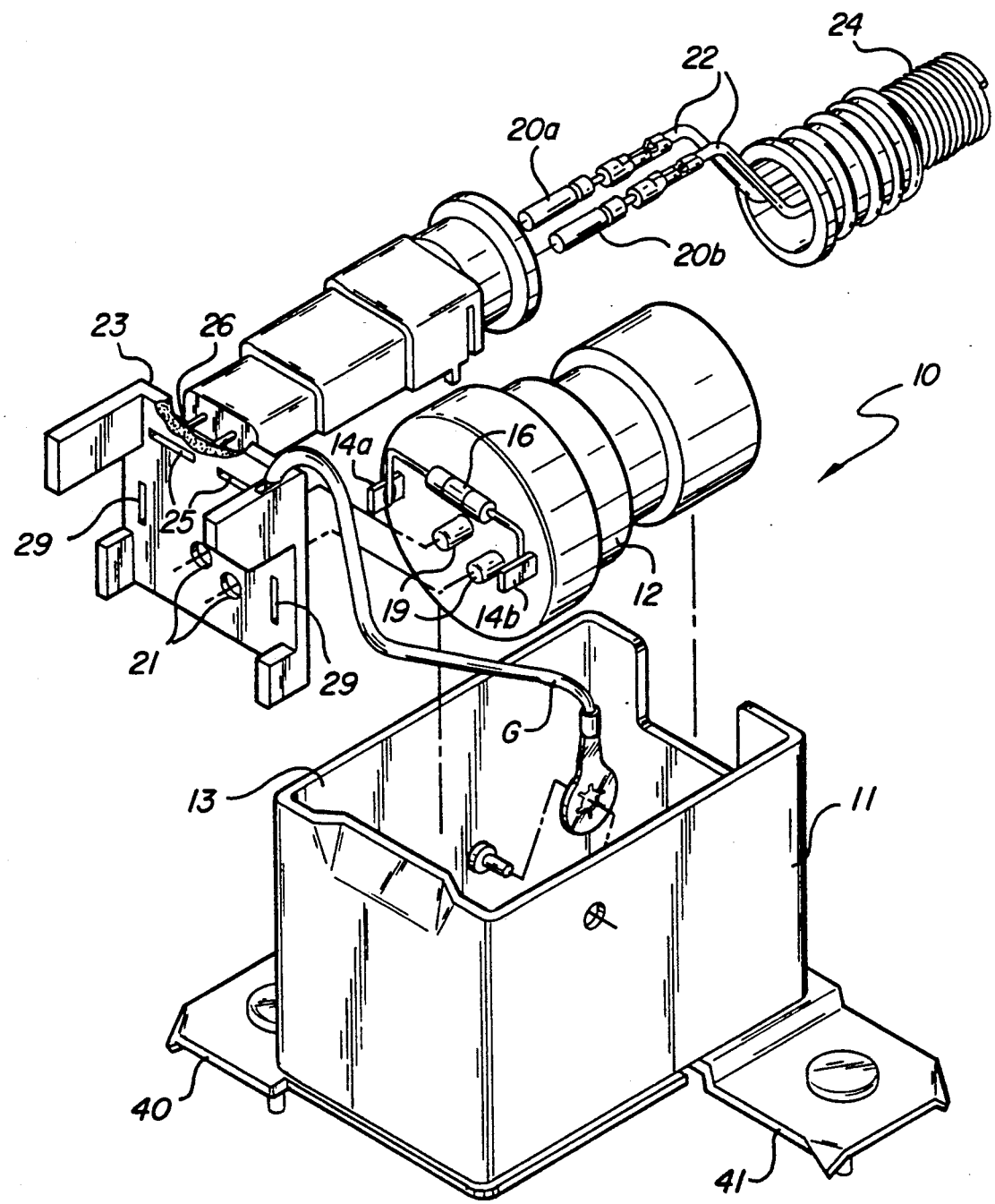
FIG. 1 is an exploded, perspective view of an air bag sensor configured in accord with the principles of the present invention, partially cut away to show various details of the construction thereof.

Throughout the following detailed description, like reference numerals are used to refer to the same elements shown in multiple figures thereof.

Referring now to the drawings and, in particular to FIG. 1, there is shown an air bag sensor 10 constructed in accord with the principles of the present invention. The sensor 10 includes a housing 11, which, preferably, is of metal and which defines an interior 13. Disposed inside interior 13 is a conventional ball and tube accelerometer, such as is manufactured by the Breed Co. of New Jersey, and is known as a Breed accelerometer. Accelerometer 12 includes terminals 14a and 14b which are in electrical connection with the sensing mechanism (not shown) disposed inside the accelerometer 12. A resistor 16 bridges the terminals 14a, 14b and is used for testing the electrical connections to the accelerometer in a manner well known to those skilled in the art.

Figure 3:
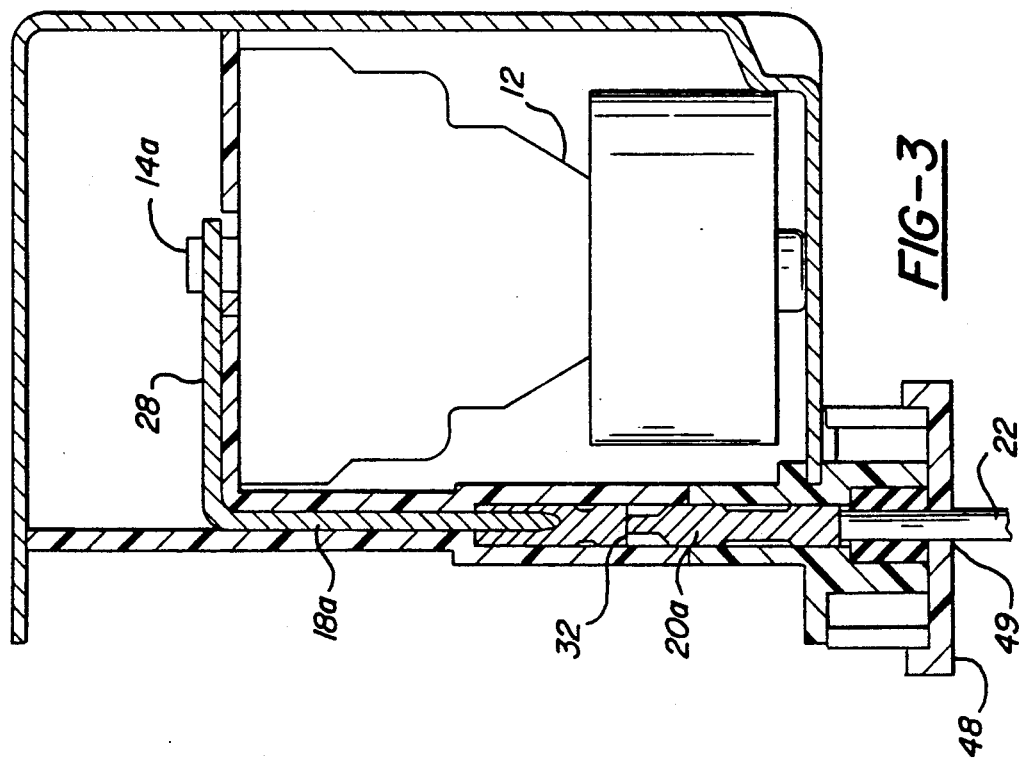
FIG. 3 is a cross-sectional view of the device of FIG. 2 taken along line 3—3.
Figure 2:
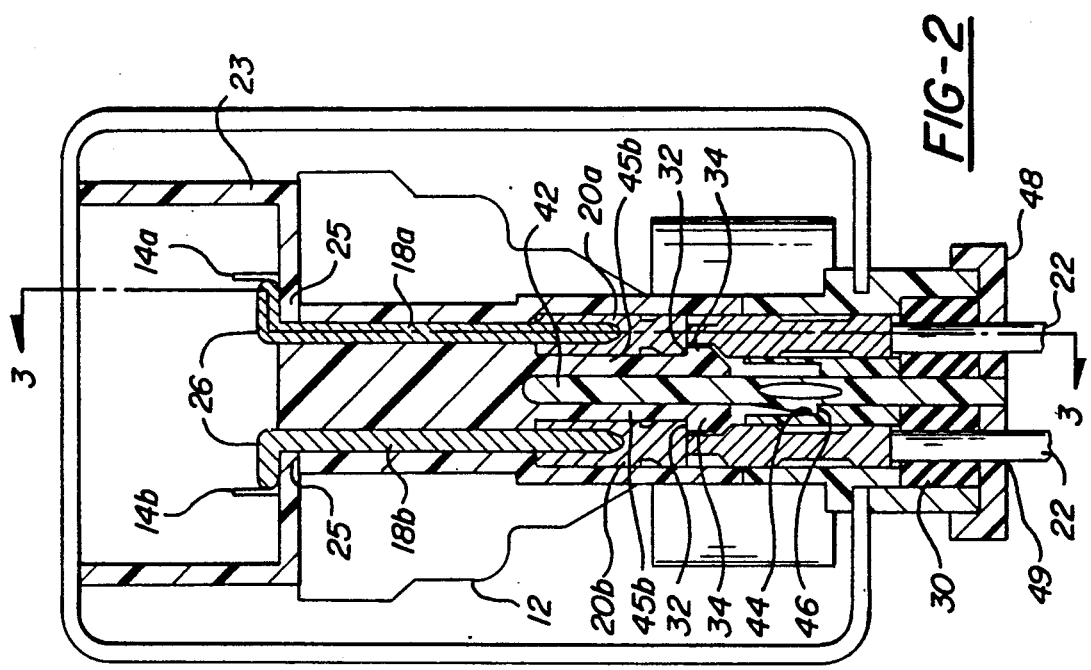
FIG. 2 is a side cross-sectional view of the sensor of FIG. 1 with the components thereof shown in their assembled positions.

The sensor 10 further includes first and second terminals 18a and 18b, best illustrated in FIG. 2. The first and second terminals 18a, 18b are in electrical contact with the terminals 14a, 14b of the accelerometer. The preferred embodiment includes a bracket 23 (partially cut away in FIG. 1) which is inserted into the interior 13 of housing 11 during the assembly process. Bracket 23 is suitably configured to maintain the various components of the sensor 10 in correct relationship to each other. Toward that end, bracket 23 further includes apertures 21 configured to receive knobs 19 which are disposed on accelerometer 12. Bracket 23 further includes a pair of slots 25 which are adapted to receive terminals 18a, 18b. As can be seen in FIGS. 2 and 3, each terminal 18a, 18b further includes a horizontally outwardly extending portion 26 and a downwardly depending portions 28. After the terminals 18a, 18b are inserted into bracket 23, the portions 28 will contact terminals 14a, 14b. These are welded together to ensure the integrity of the electrical contacts therebetween.

The terminals 18a, 18b are matingly engageable with a pair of third and fourth terminals, 20a and 20b. In the embodiment shown in the drawing, terminals 18a, 18b are male terminals and terminals 20a and 20b are female terminals, but the device can be configured so that the first and second terminals are female terminals and the third and fourth terminals are male terminals or in various mixed arrangements. Extending from the third and fourth terminals 20a, 20b are leads 22 which are in electrical contact with the wiring system 24 of a vehicle. It should be noted that the engagement between the first and second terminals 18a, 18b and the third and fourth terminals 20a, 20b occurs inside the housing 11.

As is best seen in FIG. 2, the device 10 further comprises means for preventing the accidental disengagement of terminals 18a, 18b from terminals 20a, 20b. To this end, the third and fourth terminals 20a, 20b are provided with shoulders 32. The interior 13 of housing 11 is configured to have fingers 45a and 45b, each having a stop 34 formed thereon. Each stop 34 is designed to abut against a shoulder 32. Terminals 20a, 20b are inserted into, respectively, terminals 18a, 18b until the shoulders of terminals 20a, 20b abut against stops 34. Since the components are formed of a somewhat flexible material, sufficient deformation will occur to accommodate insertion of the terminals 20a, 20b. A locking wedge 42 is inserted into housing 11 between fingers 45a and 45b to lock the terminals 20a, 20b in place. The locking wedge 42 has a shoulder 44 which engages stop 46. Wedge 42 is inserted between fingers 45a, 45b and acts to wedge shoulders 32 against stops 34 in a manner taught in our co-pending application Ser. No. 07/637,790, now U.S. Pat. No. 5,072,334. A cap 48 is placed over the wedge 42 and terminals 20a, 20b to seal interior 13. Cap 48 has formed thereon apertures 49 to permit the passage therethrough of leads 22.

In order further to protect the interior 13 of the sensor 10 from environmental degradation, sealing means 30 in the form of a gasket, preferably of silicone rubber, is provided. The gasket 30 permits the insertion of terminals 20a, 20b, but once the terminals 20a, 20b have been inserted, prevents the introduction of any environmental contaminants into the interior 11. A ground G is also provided to ground the accelerometer 12 to the housing 11.

FIGS. 2 and 3 are, respectively, top and side sectional views which show the arrangement of the components of the sensor 10 when the device is assembled. As can be seen in FIGS. 2 and 3, the ends of terminals 18a, 18b extend through slots 25 in the bracket 23, with the bent portions 26 of the terminals 18a, 18b extending outwardly, and portions 28 depending downwardly therefrom. Each depending portion 28 contacts a terminal 14a, 14b and is in electrical contact therewith. The accelerometer terminals 14a, 14b project through a pair of slots 29 (best seen in FIG. 1) formed in bracket 23 and contact the depending portions 28 of the terminals 18a, 18b to maintain electrical connection therewith. Thus, the first and second terminals 18a, 18b remain in electrical connection with accelerometer terminals 14a, 14b respectively. After the various components have been assembled, a potting compound is introduced into interior 13 and allowed to set, thereby encapsulating everything contained in housing 11.

In FIGS. 2 and 3, the third and fourth terminals 20a and 20b are shown in engagement with the first and second terminals 18a, 18b. If the sensor 10 is supplied to the vehicle manufacturer in the embodiment pictured, the leads 22 may be attached to a pig-tail connector (not shown) which may then be connected to a conventional wiring harness (not shown). Normally, the third and fourth terminals 20a, 20b will not be inserted into the housing 11 until the final stages of manufacture. Hence, the likelihood of damage to the terminals 20a, 20b and the leads 22 attached thereto will be minimized.

Alternatively, the sensor 10 may be supplied as a component to the manufacturer without the third and fourth terminals 20a, 20b. In that case, the wiring system of the vehicle may be configured to incorporate a pair of terminals of the type shown as 20a, 20b. Installation of the sensor component 10 will be greatly simplified since all that will be necessary is to insert the wired in pair of terminals into the housing 11 until they are in mating engagement with the first and second terminals 18a, 18b as described previously. Housing 11 may be provided with variously configured brackets and bolts such as those shown as 40 and 41 in FIG. 1 to mount the sensor component 10 on the vehicle.

In yet another embodiment, the device may be designed so that the first and second terminals 18a, 18b are disengageable from the third and fourth terminals 20a, 20b. A teaching of how to accomplish this is disclosed in co-pending U.S. patent application Ser. No. 07/637,790, now U.S. Pat. No. 5,072,334 referenced above. In that case, the sensor 10 is completely modular and may be easily and quickly disconnected from terminals 20a and 20b to facilitate removal and replacement.

The present invention provides for environmental sealing of an air bag sensor component and its connections thereby eliminating failure resultant from dust, dirt, moisture or corrosion. Furthermore, since those parts of the sensor which are external of the housing are not assembled until the final manufacturing steps, damage to the electrical components of the sensor is much less likely to occur.

It is to be kept in mind that while the present application describes one particular configuration of air bag sensor and connections, the particular design of such items will depend on the particular manufacturing environment, and the principles disclosed herein are readily applicable to various configurations of air bag sensors. Accordingly, the foregoing drawings, discussion and description are merely meant to be illustrative of particular embodiments of the present invention and are not meant to be limitations on the practice thereof. It is the following claims, including all equivalents, which define the scope of the invention.

We claim:

1. An environmentally sealed vehicular air bag sensor comprising:
    a housing defining an interior;
    first and second electrical terminals disposed in said interior and configured to engage within said interior third and fourth electrical terminals, respectively, said third and fourth terminals being associated with a wiring system of a vehicle;
    an accelerometer disposed in said interior and operative to provide a detectable electrical characteristic when subjected to a deceleration force of at least a preset level, said accelerometer having fifth and sixth electrical terminals in electrical communication with said first and second terminals; and
    means for sealing the interior of the housing from the ambient environment so that connection of the sensor to the wiring system is environmentally sealed.

2. The device of claim 1 wherein the sealing means comprises a sealing cap disposed on an end of said housing and configured to permit the passage therethrough said third and fourth terminals.

3. The device of claim 1 further comprising means for maintaining the first and second terminal in mating engagement with the third and fourth terminals, respectively, to prevent accidental disengagement therebetween.

4. The device of claim 1 further comprising means for establishing electrical connection between the first and second terminal and the fifth and sixth terminals, respectively.

5. The device of claim 4 wherein the means for establishing electrical connection comprises a pair of electrically conductive, opposed rods disposed in said interior.

6. The device of claim 1 wherein the first and second terminals and the accelerometer are encapsulated in said interior by a potting material.

7. The device of claim 1 further comprising said third and fourth terminals matingly engaged with the first and second terminals, respectively.

8. In a vehicular air bag sensor of the type having an accelerator operative to provide a detectable electrical characteristic when subjected to a deceleration force at least as great as a preset level, said accelerometer having a pair of terminals electrically connectable to a wiring system of a vehicle to permit the transmission of said detectable characteristic to the wiring system to actuate said air bag, the improvement comprising means for environmentally isolating the sensor including:
    a housing defining an interior;
    first and second electrical terminals disposed in said interior and configured to engage within said interior third and fourth electrical terminals, respectively, said third and fourth terminals being associated with said wiring system;
    a sealing cap disposed on an end of said housing and configured to permit the passage therethrough of said third and fourth terminals and to seal the interior of the housing from the ambient environment so that connection of the sensor to the wiring system is environmentally sealed, wherein the accelerometer is disposed in the interior and the first and second terminals are in electrical communication with the pair of terminals of the accelerometer.

9. The device of claim 8 further comprising a pair of locking fingers disposed in said housing between said third and fourth terminals, each of said fingers having a stop, said stop being configured to abut against a shoulder formed on one of said third and fourth terminals.

10. The device of claim 9 further comprising a wedge insertable between said pair of locking fingers, to wedge the stops thereof against the shoulders of the third and fourth terminals to prevent accidental disengagement of the third and fourth terminals from the first and second terminals, respectively.

11. The device of claim 10 wherein the sealing cap is disposed on an end of said wedge.

12. The device of claim 11 further comprising a rubber gasket disposed around said third and fourth terminals adjacent said cover.

* * * * *